US010198446B2

(12) United States Patent
Han et al.

(10) Patent No.: US 10,198,446 B2
(45) Date of Patent: Feb. 5, 2019

(54) APPARATUS AND METHOD FOR EXCHANGING CAD DATA

(75) Inventors: Soon Hung Han, Daejeon (KR); Jinggao Li, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 773 days.

(21) Appl. No.: 14/414,043

(22) PCT Filed: Jul. 31, 2012

(86) PCT No.: PCT/KR2012/006098
§ 371 (c)(1),
(2), (4) Date: Jan. 26, 2015

(87) PCT Pub. No.: WO2014/010775
PCT Pub. Date: Jan. 16, 2014

(65) Prior Publication Data
US 2015/0205806 A1   Jul. 23, 2015

(30) Foreign Application Priority Data

Jul. 10, 2012  (KR) .................. 10-2012-0074999

(51) Int. Cl.
*G06F 17/30*  (2006.01)
*G06F 17/50*  (2006.01)
(52) U.S. Cl.
CPC ........ *G06F 17/30076* (2013.01); *G06F 17/50* (2013.01)
(58) Field of Classification Search
None
See application file for complete search history.

(56) References Cited

U.S. PATENT DOCUMENTS

2002/0120920 A1* 8/2002 Jayaram ................. G06F 17/50
                                                    717/137
2011/0282632 A1* 11/2011 Rameau ................. G06T 17/10
                                                    703/1

FOREIGN PATENT DOCUMENTS

JP        2005-050072 A    2/2005
KR       10-0383211 A    4/2003
KR   10-2009-0099286 A    9/2009

OTHER PUBLICATIONS

Jinggao Li, Byung Chul Kim, Soonhung Han, Parametric exchange of round shapes between a mechanical CAD system and a ship CAD system, Feb. 2012, 44 Computer-Aided Design, pp. 154-161.*
Li, J. et al., "Parametric Exchange of Round Shapes Between a Mechanical CAD System and a Ship CAD System," Computer-Aided Design, Feb. 2012, pp. 154-161, vol. 44, Issue 2.

(Continued)

*Primary Examiner* — Mark D Featherstone
*Assistant Examiner* — Ranjit P Doraiswamy
(74) *Attorney, Agent, or Firm* — Fenwick & West LLP

(57) ABSTRACT

A CAD file converting device for applying CAD files created in a CAD system for machines to a CAD system for ships maps modeling units that the CAD files created in the CAD system for machines and those applied in the CAD system for ships, and converts parameter values determining feature shapes in the mapped modeling units into parameter values proper to the CAD files of the CAD system for ship design. Accordingly, CAD files of a CAD system for machines can be accurately converted into CAD files of a CAD system for ships.

10 Claims, 7 Drawing Sheets

(56) References Cited

OTHER PUBLICATIONS

Li, J. et al., "CAD Data Exchange Using the Macro-Parametrics Approach: An Error Report," International Journal of CAD/CAM, 2011, pp. 1-6, vol. 10, No. 2.

Hwang, H-J. et al., "Digital Exchange of Design Models Between Marine Equipment Libraries Using Hybrid Neutral Formats," Journal of Marine Science and Technology, Dec. 2004, pp. 182-189, vol. 9, Issue 4.

PCT International Search Report and Written Opinion, PCT Application No. PCT/KR2012/006098, dated Mar. 28, 2013, 20 pages.

* cited by examiner

APPARATUS AND METHOD FOR EXCHANGING CAD DATA

TECHNICAL FIELD

The present disclosure relates to conversion of CAD files produced by different kinds of CAD systems; and, more particularly, to an apparatus and method for converting mechanical CAD (MCAD) files created by MCAD systems through collaboration to ship CAD files applicable to a ship CAD system.

BACKGROUND ART

Recently, in the field design of various products such as machines or ships, collaborative design has emerged as an important issue in the product development process.

Especially, the design of a large vessel such as a container ship, an LNG carrier ship or an oil tanker is often a massive undertaking to which a huge number of designers need to devote their time up to several months at average. Therefore, it is general that many designers collaborate on the design of the vessels in order to shorten the time required. Thus, designers in the shipyard need to collaborate with partners from various other outside companies to which they have outsourced their design works.

Meanwhile, the outside companies and partners who participate in the ship design process commonly use different computer-aided design (CAD) systems that they prefer or that they choose to optimize the design tasks assigned to them. Even within a single company, designers may use different CAD systems that are most suitable for their tasks. That is, throughout the entire ship design process, the shipyard usually uses a CAD system developed for CAD processing of ship design (hereinafter, referred to as a "ship CAD system"), whereas their partner companies involved in various partial design tasks such as design of ship equipment or the like mainly utilize mechanical CAD (MCAD) systems.

Thus, in order to collect and integrate the partial designs created by the individual partners outside the shipyard using the various MCAD systems and to import those individual designs into the ship CAD system used in the shipyard, it is necessary to convert design data between the different kinds of CAD systems, i.e., between the MCAD systems and the ship CAD system. For example, in the mechanical CAD systems, the term "feature" is used to designate a modeling unit that constitutes a CAD file, whereas the term "primitive" is used in the ship CAD system for the same purpose. Hence, it is necessary to convert CAD data through appropriate direct or indirect mapping between features and primitives.

In this regard, disclosed in Korean Patent No. 10-038211 registered on Apr. 24, 2003 is a technique directed to a component information providing system for providing three-dimensional CAD model data, which has parametrics information, in the form of digital catalog.

Conventionally, however, there has been proposed no specific framework for a direct or indirect mapping operation between modeling units in the process of converting a CAD file produced by a MCAD system to a CAD file applicable to the ship CAD system. Thus, many problems have occurred during the process of applying the CAD file created by the MCAD system to the ship CAD system.

DISCLOSURE

Technical Problem

In view of the foregoing problems, the present disclosure provides an apparatus and method for converting a mechanical CAD (MCAD) file created by a MCAD system to a ship CAD file applicable to a ship CAD system for use in designing a ship by mapping corresponding modeling units between the MCAD file created by the MCAD system and the ship CAD file to be applied to the ship CAD system and converting parameter values defining features within each mapped modeling unit to parameter values suitable for the ship CAD system, thus enabling to convert the MCAD file to the ship CAD file more accurately.

Technical Solution

In accordance with an embodiment of the present invention, a CAD date converting apparatus includes: a file receiving unit configured to receive a first-format CAD file; a mapping unit configured to analyze the first-format CAD file and perform mapping of a modeling unit of the first-format CAD file to a modeling unit of a second format to be created; a parameter conversion unit configured to convert parameter values included in the mapped modeling unit to parameter values corresponding to the modeling unit to be created; and a file transmission unit configured to create the second-format CAD file by using the converted parameter values and send the created second-format CAD file to a ship CAD system.

In the embodiment, the first-format CAD file is a CAD file created by a mechanical CAD (MCAD) system, and the second-format CAD file is a ship CAD file.

In the embodiment, the first-format CAD file is organized in an XML (Extended Markup Language) file format.

In the embodiment, the modeling unit of the first-format CAD file is a feature, and the modeling unit of the second-format CAD file is a primitive.

In the embodiment, the mapping unit extracts a profile sketch corresponding to a relevant protruded extrusion feature from a side-edge of the first-format CAD file; extracts vertex information of a connection point connecting the profile sketch and the side edge; and forms a round shape on the protruded extrusion feature.

In the embodiment, the mapping unit retrieves and extracts a feature forming the side edge from a feature list within the first-format CAD file.

In the embodiment, the mapping unit retrieves and extracts location information of the connection point from a point list of the profile sketch within the first-format CAD file.

In the embodiment, the mapping unit extracts a length and a radius of a fillet edge from a protruded extrusion feature of the first-format CAD file; creates a negative extrusion profile by using the extracted length and radius; extracts, from the negative extrusion profile, information of a connection point to which the radius of the fillet edge is assigned; and forms a round shape on the protruded extrusion feature.

In the embodiment, the mapping unit extracts a revolution feature from a protruded extrusion feature of the first-format CAD file; acquires a profile sketch corresponding to the revolution feature; extracts vertex information of a connection point connecting the profile sketch and the revolution feature; and forms a round shape along a fillet edge of the revolution feature, starting from the connection point.

In the embodiment, the mapping unit extracts a height value and a fillet radius property from a protruded extrusion feature of the first-format CAD file; creates a rectangular profile of a revolution primitive by using the height value and the fillet radius property; extracts a vertex point of the rectangular profile connected to the fillet radius property; and forms a round shape according the fillet radius property.

In accordance with an embodiment of the present invention, a CAD data converting method of converting CAD files between different kinds of CAD systems includes: receiving a first-format CAD file; analyzing the first-format CAD file and mapping a modeling unit of the first-format CAD file to a modeling unit of a second-format CAD file to be created; converting parameter values included in the mapped modeling unit to parameter values corresponding to the modeling unit to be created; and creating the second-format CAD file by using the converted parameter values and sending the created second-format CAD file to a ship CAD system.

In the embodiment, the process of mapping includes: extracting a profile sketch corresponding to a side edge from a protruded extrusion feature of the first-format CAD file; and extracting vertex information of a connection point connecting the profile sketch and the side edge; and forming a round shape on the protruded extrusion feature.

In the embodiment, the profile sketch is retrieved from a feature list within the first-format CAD file.

In the embodiment, location information of the connection point is retrieved from a point list of the profile sketch within the first-format CAD file.

In the embodiment, the process of mapping includes: extracting a length and a radius of a fillet edge from a protruded extrusion feature of the first-format CAD file; creating a negative extrusion profile by using the extracted length and radius; and extracting, from the negative extrusion profile, information of a connection point to which the radius of the fillet edge is assigned; and forming a round shape on the protruded extrusion feature.

In the embodiment, the process of mapping includes: extracting a revolution feature from a protruded extrusion feature of the first-format CAD file; acquiring a profile sketch corresponding to the revolution feature; extracting vertex information of a connection point connecting the profile sketch and the revolution feature; and forming a round shape along a fillet edge of the revolution feature, starting from the connection point.

In the embodiment, the process of mapping includes: extracting a height value and a fillet radius property from a protruded extrusion feature of the first-format CAD file; creating a rectangular profile of a revolution primitive by using the height value and the fillet radius property; extracting a vertex point of the rectangular profile connected to the fillet radius property; and forming a round shape according the fillet radius property.

In the embodiment, the first-format CAD file is a CAD file created by a mechanical CAD (MCAD) system, and the second-format CAD file is a ship CAD file.

In the embodiment, the first-format CAD file is organized in an XML file format.

In the embodiment, the modeling unit of the first-format CAD file is a feature, and the modeling unit of the second-format CAD file is a primitive.

Advantageous Effects

According to the exemplary embodiments of the present disclosure, in the process of converting CAD files produced by MCAD systems through collaboration to CAD data applicable to a ship CAD system for use in conducting ship design, by mapping corresponding modeling units between a MCAD file processed by the MCAD systems and a ship CAD file to be applied to a ship CAD system and converting parameter values defining features within each mapped modelling unit to parameter values suitable for the CAD file of the ship CAD system, it is possible to convert the MCAD file to the ship CAD file more accurately.

BEST MODE

Hereinafter, operational principles of the present disclosure will be elaborated with reference to the accompanying drawings, which form a part hereof. In discussing the present disclosure, detailed description of known functions or configurations will be omitted when the description disturbs clear understanding of the essentials of the present disclosure. Further, the various terms used below are defined in consideration of functions in the present disclosure, and different terms may be used depending on users, operator or practices in the relevant art. Thus, definition of the various terms used in the present application should be formulated based on the whole disclosure of the present application.

FIG. 1a to FIG. 1d are conceptual diagrams for describing a process of generating a protruded extrusion feature and classifying the kinds of relevant fillet edges in a MCAD system in accordance with an exemplary embodiment of the present disclosure.

Below, indirect mapping for converting a MCAD file created by a MCAD system to a CAD file applicable to a ship CAD system will be described in detail with reference to FIG. 1a to FIG. 1d. The ship CAD system may be, by way of example, but not limitation, AVEVA marine system or the like, and the ship CAD file may be, by way of non-limiting example, an AM macro file, or the like.

First, since fillet features in the MCAD system cannot be directly mapped to be applied to the ship CAD system, another approach for the conversion of a CAD file is needed.

A fillet feature of the MCAD system is defined by a fillet edge and a fillet radius. This fillet feature may correspond to a radius property of a vertex of a profile which is used in an extrusion primitive or a revolution primitive in the ship CAD system.

Fillet edges can be classified into two types: line segment and circular arc. The line segment can be further divided into two subtypes: side-edge and start (or end) face-edge.

Also, the circular arc can be further divided into two subtypes: extruded-arc and revolved-arc.

Here, it can be assumed that a fillet edge as mentioned above is created from a protruded extrusion feature or a revolution feature of the MCAD system.

Figure 1A:
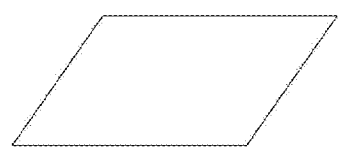
FIG. 1A to FIG. 1D are conceptual diagrams for describing a process of creating a protruded extrusion feature and classifying the kinds of relevant fillet edges in a mechanical CAD system in accordance with an exemplary embodiment of the present disclosure.
Figure 1B:
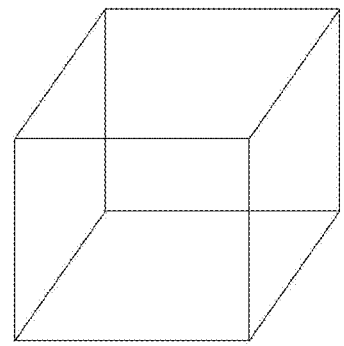
Figure 1C:
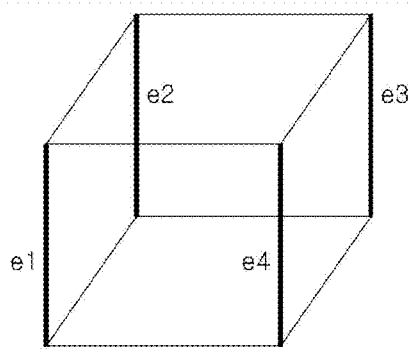
Figure 1D:
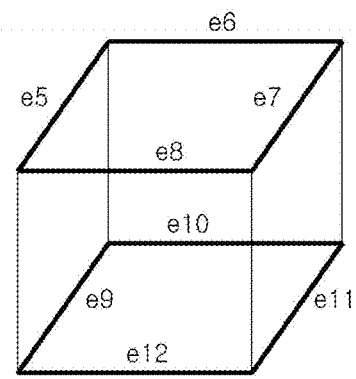

FIG. 1A and FIG. 1B illustrate a profile sketch and a protruded extrusion feature. After a single model is generated, edges on side faces can be named side edges (e1 to e4) as shown in FIG. 1C, whereas edges on a start face or an end face can be named start (or end) face-edges (e5 to e8, e9 to e11) as depicted in FIG. 1D.

Figure 2:
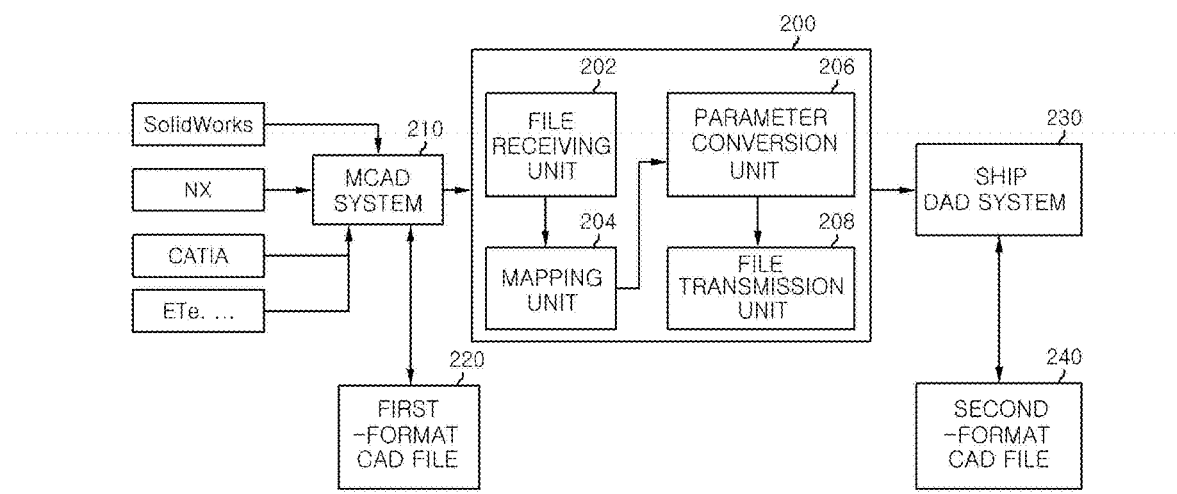
FIG. 2 is a detailed block diagram illustrating a CAD data converting device configured to convert CAD files between different kinds of CAD systems in accordance with the exemplary embodiment of the present disclosure.

FIG. 2 is a block diagram illustrating a detailed configuration of a CAD data converting device 200 configured to convert CAD files between a MCAD system and a ship CAD system in accordance with an exemplary embodiment of the present disclosure. The CAD data converting device 200 in accordance with the exemplary embodiment includes a file receiving unit (part file importer) 202, a mapping unit (feature and primitive mapping module) 204, a parameter conversion unit 206, a file transmission unit (AM (AVEVA Marine) macro file exporter) 208, and so forth.

First, the file receiving unit 202 receives a first-format CAD file) 220 created by an outside company. Here, the outside company means a design company outside a shipyard to which the shipyard assigns partial design works for the purpose of collaborative ship design. Most of these outside companies conduct their design tasks by using a CAD system 210 for machine (hereinafter, referred to as "MCAD system 210"). Thus, the first-format CAD file 220 may imply a CAD file created by a MCAD system, and such a CAD file 220 may be mostly created in the form of an XML document. That is, the file receiving unit 202 receives the first-format CAD file and sends the received first-format CAD file to the mapping unit 204.

The mapping unit 204 analyzes the received first-format CAD file 220 and performs mapping of a modeling unit of the first-format CAD file 220 with a modeling unit of a second-format CAD file 240 to which the first-format CAD file is to be converted. Here, the second-format CAD file 240 may imply, for example, a CAD file applicable to a CAD 230 system for ship design (hereinafter, referred to as "ship CAD system 230"). The modeling unit of the first-format CAD file 220, which is a MCAD file, may be referred to as "feature", whereas the modeling unit of the second-format CAD file 240, which is a ship CAD file, may be named "primitive".

In a mapping process for a side-edge, for example, the mapping unit 204 extracts a profile sketch corresponding to the side-edge from a protruded extrusion feature of the first-format CAD file 220; extracts vertex information of a connection point connecting the profile sketch and the side edge; and forms a round shape on the protruded extrusion feature. At this time, the mapping unit 204 may retrieve and extract a profile sketch shape connected to the side edge from a feature list within the first-format CAD file and, also, may retrieve and extract location information of the connection point from a point list of the profile sketch within the first-format CAD file.

Further, during a mapping process for a start (or end) face-edge, for example, the mapping unit 204 extracts a length and a radius of a fillet edge from a protruded extrusion feature of the first-format CAD file 220; creates a negative extrusion profile by using the extracted length and radius; extracts, from the negative extrusion profile, information of a connection point to which the radius of the fillet edge is assigned; and then creates a round shape on the protruded extrusion feature.

Further, in a mapping process for a revolved-arc, for example, the mapping unit 204 extracts a revolution feature from a protruded extrusion feature of the first-format CAD file 220; acquires a profile sketch corresponding to the revolution feature; extracts vertex information of a connection point connecting the profile sketch and the revolution feature; and forms a round shape along the fillet edge of the revolution feature, starting from the connection point.

Also, in a mapping process for an extruded-arc, the mapping unit 204 extracts a height value and a fillet radius property from a protruded extrusion feature of the first-format CAD file 220; creates a rectangular profile of a revolution primitive by using the height value and the fillet radius property; extracts a vertex point of the rectangular profile connected to the fillet radius property; and forms a round shape according the fillet radius property.

The parameter conversion unit 206 converts parameter values included in the mapped modeling unit to parameter values corresponding to the modeling unit intended to be created through conversion.

The file transmission unit 208 composes the second-format CAD file 240, which is a ship CAD file that can be applied to the ship CAD system 230, by using the converted parameter values, and provides the created second-format CAD file 240 to the ship CAD system 230.

Figures 3A, 3B:
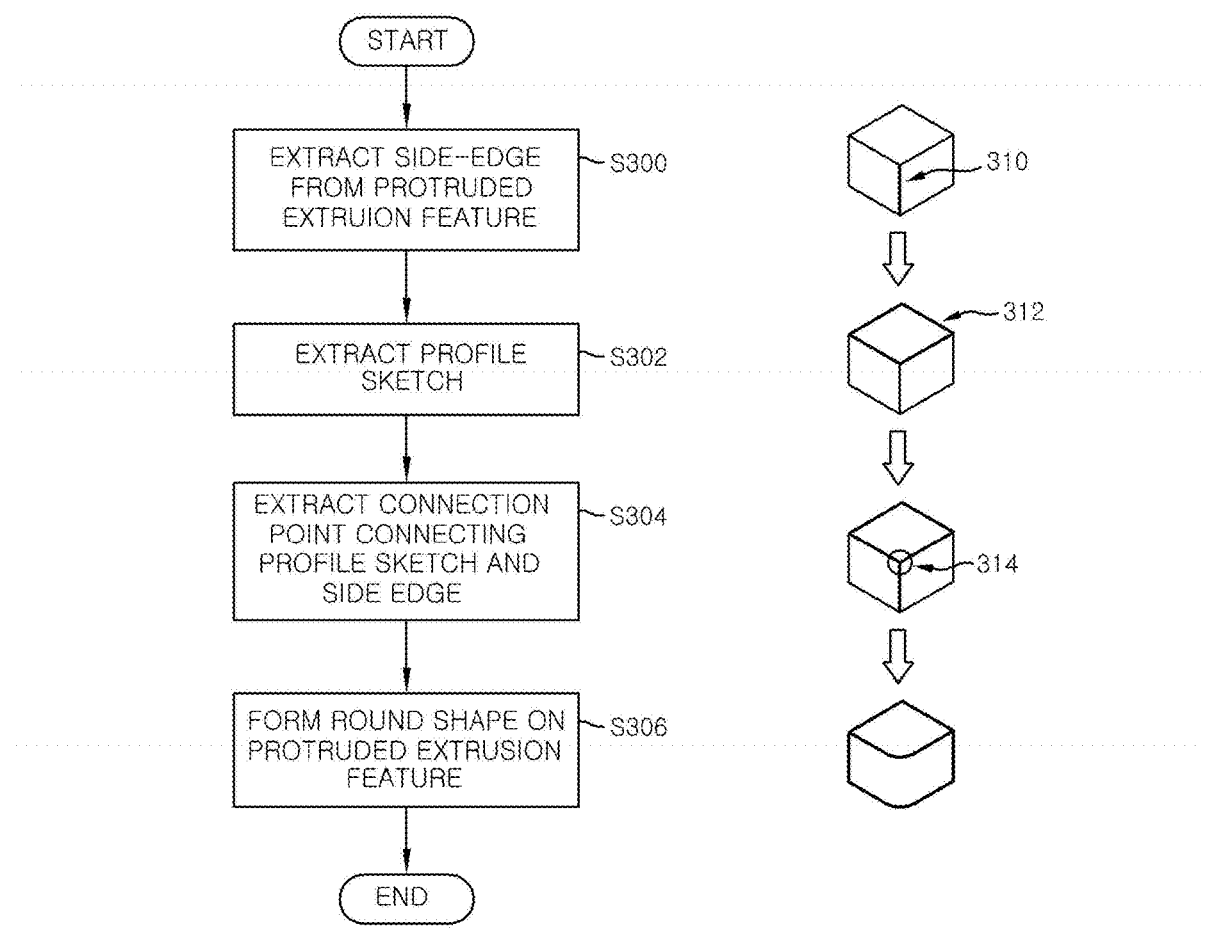
FIG. 3A is a flowchart for describing a control procedure for an operation of performing side edge conversion in the CAD data converting device in accordance with the exemplary embodiment of the present disclosure.
FIG. 3B is a diagram illustrating a model shape formed in the conversion process.

FIG. 3A is a flowchart for describing a control procedure for an operation of performing conversion on a fillet feature in the CAD data converting device in accordance with an exemplary embodiment of the present disclosure. FIG. 3B is a diagram illustrating a model shape formed in the conversion process. Below, the present exemplary embodiment will be elaborated with reference to FIG. 2 and FIGS. 3A and 3B.

First, the CAD data converting device 200 extracts a side-edge 310 from a protruded extrusion feature of a first-format CAD file 220, which is a MCAD file inputted from a MCAD system 210 (S300).

Figure 4:
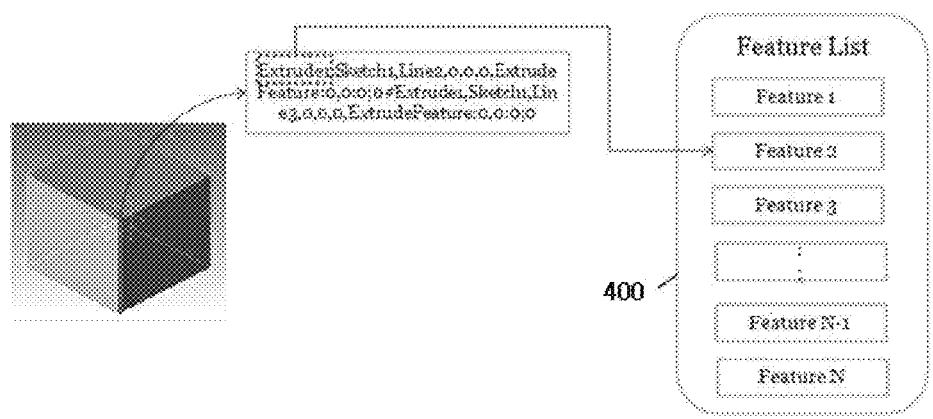
FIG. 4 is a conceptual diagram for describing a process of extracting a feature in the CAD data converting device in accordance with the exemplary embodiment of the present disclosure.

Then, the CAD data converting device 200 extracts a profile sketch 312 corresponding to the extracted side-edge 310 (S302). At this time, in the process of extracting the profile sketch 312, the CAD data converting device 200 retrieves a feature forming the side-edge from a feature list 400 included in the first-format CAD file 220, as shown in FIG. 4.

After extracting the profile sketch 312, the CAD data converting device 200 extracts vertex information of a connection point 314 connecting the profile sketch 312 and the side edge 310 (S304), and forms a round shape 316 on the protruded extrusion feature (S306).

Figure 5:
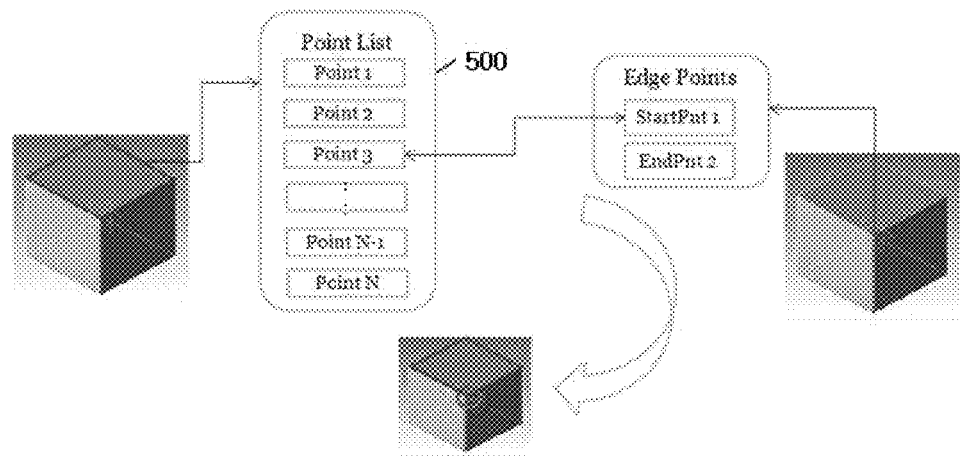
FIG. 5 is a conceptual diagram for describing a process of extracting a connection point in the CAD data converting device in accordance with the exemplary embodiment of the present disclosure.

At this time, in the process of extracting the vertex information of the connection point, the CAD data converting device 200 may retrieve and extract location information of the connection point from a point list 500 of the profile sketch 312 within the first-format CAD file 220, as depicted in FIG. 5.

Figure 6:
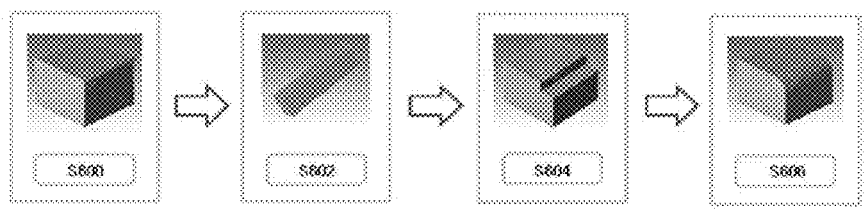
FIG. 6 provides diagrams for describing a control procedure for an operation of converting start/end face-edge conversion in the CAD data converting device in accordance with the exemplary embodiment of the present disclosure.

FIG. 6 provides diagrams illustrating a control procedure for an operation of performing conversion on a start face-edge in the CAD data converting device in accordance with an exemplary embodiment of the present disclosure. First, the CAD data converting device 200 extracts a length and a radius of a fillet edge from a protruded extrusion feature of a first-format CAD file 220 (S600).

Then, the CAD data converting device 200 creates a negative extrusion profile by using the length and the radius of the fillet edge (S602) and extracts, from the negative protrusion profile, information of a connection point to which the radius of the fillet edge is assigned (S604).

Afterwards, the CAD data converting device 200 forms a round shape on the protruded extrusion shape by using the connection point information (S602).

Figure 7:
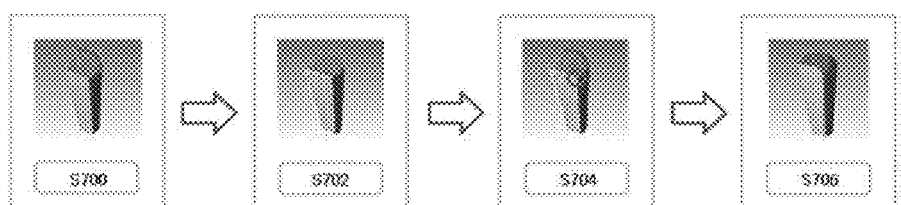
FIG. 7 provides diagrams for describing a control procedure for an operation of converting a revolved-arc conversion in the CAD data converting device in accordance with the exemplary embodiment of the present disclosure.

FIG. 7 provides diagrams illustrating a control procedure for an operation of performing conversion on a revolved-arc in the CAD data converting device 200 in accordance with an exemplary embodiment of the present disclosure. First, the CAD data converting device 200 extracts a revolution feature from a protruded extrusion feature of a first-format CAD file 220 (S700).

Then, the CAD data converting device 200 acquires a profile sketch corresponding to the extracted revolution feature (S702) and then extracts vertex information of a connection point connecting the profile sketch and the revolution feature (S704).

Subsequently, the CAD data converting device 200 creates a round shape along the fillet edge of the revolution feature, starting from the connection point (S706).

Figure 8:
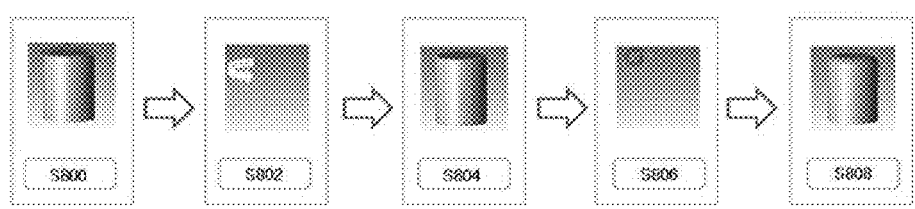
FIG. 8 provides diagrams for describing a control procedure for an operation of converting an extruded-arc conversion in the CAD data converting device in accordance with the exemplary embodiment of the present disclosure.

FIG. 8 provides diagrams illustrating a control procedure for an operation of performing conversion on an extruded-arc in the CAD data converting device 200 in accordance with an exemplary embodiment of the present disclosure. First, the CAD data converting device 200 obtains a protruded extrusion feature of a first-format CAD 220, which is a MCAD file inputted from a MCAD system 210 (S800).

Then, the CAD data converting device 200 extracts a height value and a fillet radius property from the protruded extrusion feature of the first-format CAD file 220 (S802) and creates a rectangular profile of a revolution primitive by using the height value and the fillet radius property (S804).

Afterwards, the CAD data converting device 200 extracts a connection point of the rectangular profile connected to the fillet radius property (S806) and, then, forms a round shape according to the extracted connection point and the fillet radius property (S808).

Figure 9:
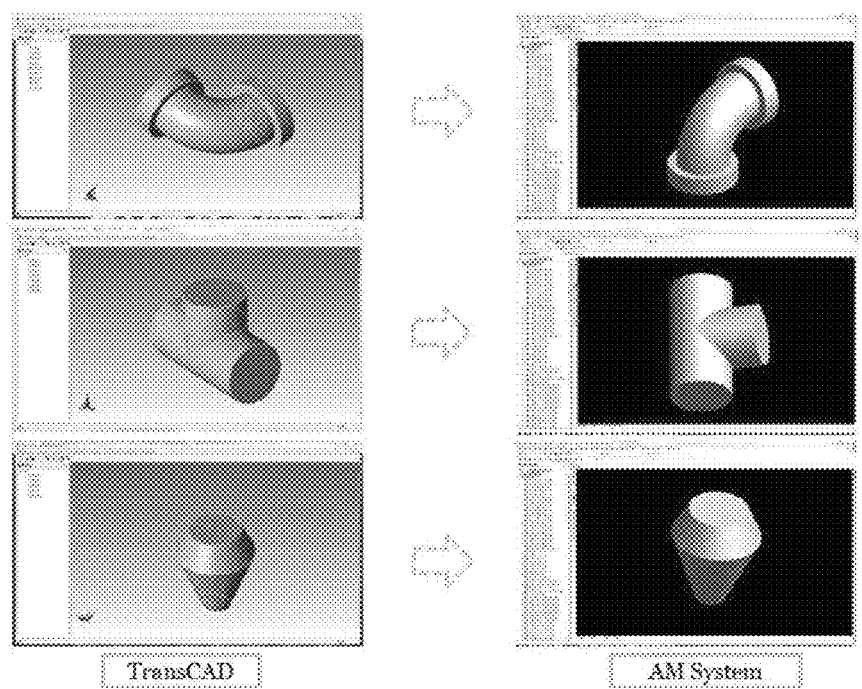
FIG. 9 and FIG. 10 are diagrams illustrating examples of various shapes converted from a CAD file of a MCAD system to a CAD file of a ship CAD system in accordance with the exemplary embodiment of the present disclosure.
Figure 10:
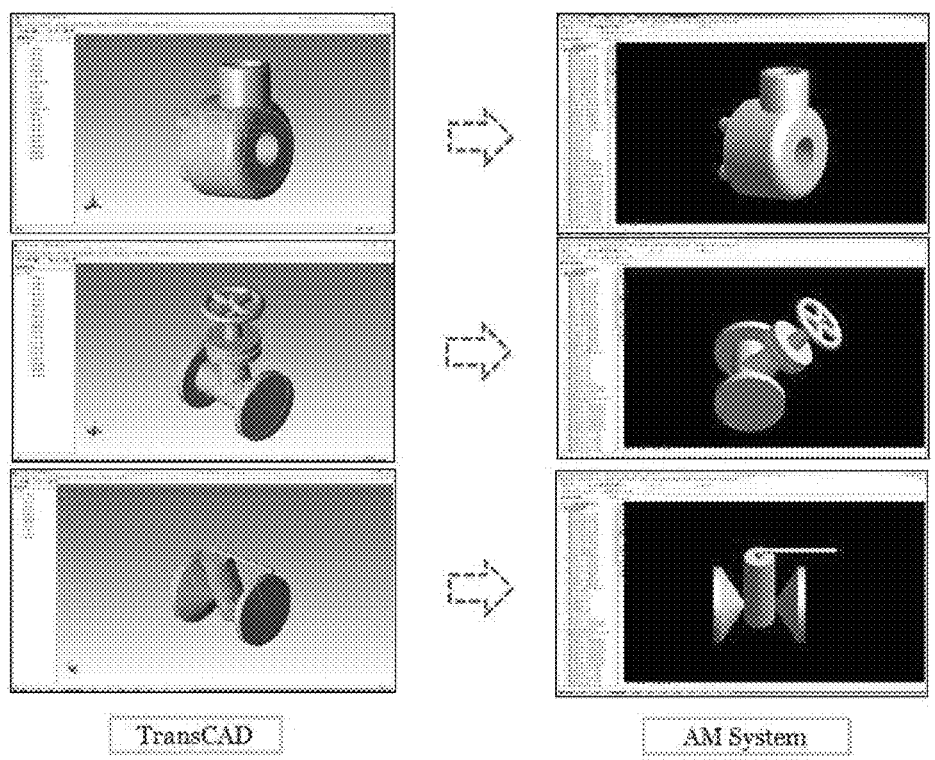

FIG. 9 and FIG. 10 illustrate examples of various shapes converted from a MCAD file produced by the MCAD system 210 to a CAD file applicable to the ship CAD system 230 in accordance with the exemplary embodiments of the present disclosure.

As can be seen from FIG. 9 and FIG. 10, by mapping corresponding modeling units between a MCAD file produced by the MCAD system and a ship CAD file to be applied to the ship CAD system and converting parameter values defining a feature within each mapped modeling unit to parameter values suitable for the ship CAD file of the ship CAD system, it is possible to convert the MCAD file to the ship CAD file more accurately.

As stated above, in conversion of a MCAD file created by the MCAD system to a ship CAD file to be applied to the ship CAD system for use in conducting ship design, by mapping corresponding modeling units between the MCAD file created by the MCAD system and the ship CAD file to be applied to the ship CAD system and converting parameter values defining features within each mapped modeling unit to parameter values suitable for the ship CAD system, it is possible to convert the MCAD file to the ship CAD file more accurately.

Although exemplary embodiments of the present disclosure are described above with reference to the accompanying drawings, those skilled in the art will understand that the present disclosure may be implemented in various ways without changing the necessary features or the spirit of the present disclosure. Therefore, it should be understood that the exemplary embodiments described above are not limiting, but only an example in all respects. The scope of the present disclosure is expressed by claims below, not the detailed description, and it should be construed that all changes and modifications achieved from the meanings and scope of claims and equivalent concepts are included in the scope of the present disclosure.

The invention claimed is:

1. A computer-aided design (CAD) data converting device for converting CAD files between different kinds of CAD systems, comprising:
   a memory;
   a processor coupled to the memory, the processor configured to:
      receive a mechanical CAD (MCAD) file created by an MCAD system;
      analyze the mechanical CAD file and perform mapping of a feature-based modeling unit of the mechanical CAD file to a primitive-based modeling unit of a ship CAD file to which the mechanical CAD file is to be converted;
      convert parameter values included in the mapped feature-based modeling unit to parameter values corresponding to the primitive-based modeling unit to be created; and
      create the ship CAD file by using the converted parameter values and send the created ship CAD file to a ship CAD system,
   wherein the mapping of the feature-based modeling unit to the primitive-based modeling unit is performed by (i) retrieving and extracting a side edge from a protruded extrusion feature from a feature list within the mechanical CAD file; (ii) extracting a profile sketch connected to the side-edge from the feature list; (iii) retrieving and extracting location information of a connection point connecting the profile sketch and the side edge from a point list of the profile sketch within the mechanical CAD file; (iv) extracting vertex information of flail the connection point; and (iii) forming a round shape on the protruded extrusion feature.

2. The CAD data converting device of claim 1, wherein the mechanical CAD file is organized in an extended markup language (XML) file format.

3. The CAD data converting device of claim 1, wherein the mapping of the modeling unit is performed further by extracting a length and a radius of a fillet edge from the protruded extrusion feature of the mechanical CAD file; creating a negative extrusion profile by using the extracted length and radius; extracting, from the negative extrusion profile, information of a connection point to which the radius of the fillet edge is assigned; and forming a round shape on the protruded extrusion feature.

4. The CAD data converting device of claim 1, wherein the mapping of the modeling unit is performed further by extracting a revolution feature from a protruded extrusion feature of the mechanical CAD file; acquiring a profile sketch corresponding to the revolution feature; extracting vertex information of a connection point connecting the profile sketch and the revolution feature; and forming a round shape along a fillet edge of the revolution feature, starting from the connection point.

5. The CAD data converting device of claim 1, wherein the mapping of the modeling unit is performed further by extracting a height value and a fillet radius property from a protruded extrusion feature of the mechanical CAD file; creating a rectangular profile of a revolution primitive by using the height value and the fillet radius property; extracting a vertex point of the rectangular profile connected to the fillet radius property; and forming a round shape according the fillet radius property.

6. A CAD data converting method of converting CAD files between different kinds of CAD systems, the method comprising:
receiving a mechanical CAD (MCAD) file created by an MCAD system;
analyzing the mechanical CAD file and mapping a feature-based modeling unit of the mechanical CAD file to a primitive-based modeling unit of a ship CAD file to which the mechanical CAD file is to be converted;
converting parameter values included in the mapped feature-based modeling unit to parameter values corresponding to the primitive-based modeling unit to be created; and
creating the ship CAD file by using the converted parameter values and sending the created ship CAD file to a ship CAD system,
wherein the mapping comprises:
(i) retrieving and extracting a side edge from a protruded extrusion feature from a feature list within the mechanical CAD file;
(ii) extracting a profile sketch connected to the side edge from the feature list;
(iii) retrieving and extracting location information of a connection point connecting the profile sketch and the side edge from a point list of the profile sketch within the mechanical CAD file;
(iv) extracting vertex information of the connection point and
(iii) forming a round shape on the protruded extrusion feature.

7. The CAD data converting method of claim 6, wherein the mapping further comprises:
extracting a length and a radius of a fillet edge from a protruded extrusion feature of the mechanical CAD file;
creating a negative extrusion profile by using the extracted length and radius; and
extracting, from the negative extrusion profile, information of a connection point to which the radius of the fillet edge is assigned; and
forming a round shape on the protruded extrusion feature.

8. The CAD data converting method of claim 6, wherein the mapping further comprises:
extracting a revolution feature from a protruded extrusion feature of the mechanical CAD file;
acquiring a profile sketch corresponding to the revolution feature;
extracting vertex information of a connection point connecting the profile sketch and the revolution feature; and
forming a round shape along a fillet edge of the revolution feature, starting from the connection point.

9. The CAD data converting method of claim 6, wherein the mapping further comprises:
extracting a height value and a fillet radius property from a protruded extrusion feature of the mechanical CAD file;
creating a rectangular profile of a revolution primitive by using the height value and the fillet radius property;
extracting a vertex point of the rectangular profile connected to the fillet radius property; and
forming a round shape according the fillet radius property.

10. The CAD data converting method of claim 6, wherein the mechanical CAD file is organized in an XML file format.

* * * * *